(12) United States Patent
Shumarayev et al.

(10) Patent No.: US 7,812,634 B1
(45) Date of Patent: Oct. 12, 2010

(54) PROGRAMMABLE LOGIC DEVICE TRANSCEIVER ARCHITECTURES THAT FACILITATE USING VARIOUS NUMBERS OF TRANSCEIVER CHANNELS TOGETHER

(75) Inventors: Sergey Shumarayev, Los Altos Hills, CA (US); Thungoc M. Tran, San Jose, CA (US); Tim Tri Hoang, San Jose, CA (US)

(73) Assignee: Altera Corporation, San Jose, CA (US)

(*) Notice: Subject to any disclaimer, the term of this patent is extended or adjusted under 35 U.S.C. 154(b) by 867 days.

(21) Appl. No.: 11/726,471

(22) Filed: Mar. 21, 2007

(51) Int. Cl.
*H03K 19/173* (2006.01)
(52) U.S. Cl. .......................... 326/38; 326/41
(58) Field of Classification Search ............. 326/37–41; 375/219
See application file for complete search history.

(56) References Cited

U.S. PATENT DOCUMENTS

| | | | |
|---|---|---|---|
| 6,750,675 B2 * | 6/2004 | Venkata et al. ................. 326/41 |
| 7,276,936 B1 * | 10/2007 | Hoang et al. ................... 326/41 |
| 7,276,937 B2 * | 10/2007 | Hoang et al. ................... 326/41 |
| 7,304,498 B2 * | 12/2007 | Bereza et al. .................. 326/38 |
| 7,304,507 B1 * | 12/2007 | Tran et al. ...................... 326/93 |
| 7,414,429 B1 * | 8/2008 | Kim et al. ....................... 326/41 |
| 7,539,278 B2 * | 5/2009 | Shumarayev et al. ........ 375/376 |
| 7,590,207 B1 * | 9/2009 | Shumarayev et al. ........ 375/354 |
| 7,602,212 B1 * | 10/2009 | Chan et al. ..................... 326/37 |
| 7,656,187 B2 * | 2/2010 | Tran et al. ...................... 326/38 |
| 7,656,323 B2 * | 2/2010 | Bereza et al. ................. 341/100 |

\* cited by examiner

*Primary Examiner*—Vibol Tan
(74) *Attorney, Agent, or Firm*—Ropes & Gray LLP; Robert R. Jackson

(57) ABSTRACT

Transceiver circuitry on a programmable logic device integrated circuit ("PLD") is preferably provided in a plurality of identical or at least similar modules. Each module preferably includes a plurality of transceiver channels and a clock source unit. Clock distribution circuitry is provided for distributing the signal of a module's clock source to all of the transceiver channels in that module, and also selectively beyond that module to other modules.

17 Claims, 4 Drawing Sheets

PROGRAMMABLE LOGIC DEVICE TRANSCEIVER ARCHITECTURES THAT FACILITATE USING VARIOUS NUMBERS OF TRANSCEIVER CHANNELS TOGETHER

BACKGROUND OF THE INVENTION

This invention relates to programmable logic integrated circuit devices ("PLDs"), and more particularly to input/output (transceiver) circuitry on PLDs.

PLDs are typically designed to be general purpose devices. As such, a given PLD product can be employed by each of many different users to perform the particular tasks required by that user. Each user customizes (programs or configures) the PLD product to perform the tasks that user needs to have performed. The more users a PLD product can satisfy, the greater the potential market for that PLD product. Greater market volume tends to reduce unit cost for the PLD product. Of course, giving a PLD product too much capability tends to increase its size and complexity, which can put upward pressure on unit cost. It is therefore important to find low-cost ways to increase the flexibility of use of PLD products.

There are many different communication data protocols for which it may be desired to use a PLD. Some of these may require one or more transceiver channels on the PLD to be used individually. Others may require various numbers of transceiver channels on the PLD to be used together. For example, a communication protocol may require the PLD to transmit four high-speed serial data signals synchronously or substantially synchronously. Another protocol may require the PLD to transmit eight high-speed serial data signals synchronously or substantially synchronously. Typically a requirement for such synchronism means that all of the synchronized outputs need to be clocked by the same clock signal with no more than an acceptably small amount of skew between the output channels. (Skew is time delay between the otherwise synchronized outputs of two channels.) Transceiver clock distribution architectures are known that can efficiently synchronize up to eight channels. But there is now increasing interest in communication protocols that require synchronization of more than eight channels.

SUMMARY OF THE INVENTION

In accordance with the present invention, transceiver circuitry on a programmable logic integrated circuit device may be made up of a plurality of modules. Each module may include (1) a plurality of channels of transceiver circuitry, (2) a clock source circuit, (3) a first clock signal distribution circuit extending from the clock source circuit to all of the transceiver channels in the module, (4) a second clock signal distribution circuit coextensive with the first such circuit, and (5) selection circuitry associated with each of the channels for allowing that channel to select a clock signal from either of the first and second clock signal distribution circuits. The circuitry may further include routing circuitry for allowing a signal to flow from either of the first and second clock distribution circuits of each module to the second clock distribution circuits of two other modules that are adjacent to the first-mentioned module.

Further features of the invention, its nature and various advantages, will be more apparent from the accompanying drawings and the following detailed description.

DETAILED DESCRIPTION

Figure 1:
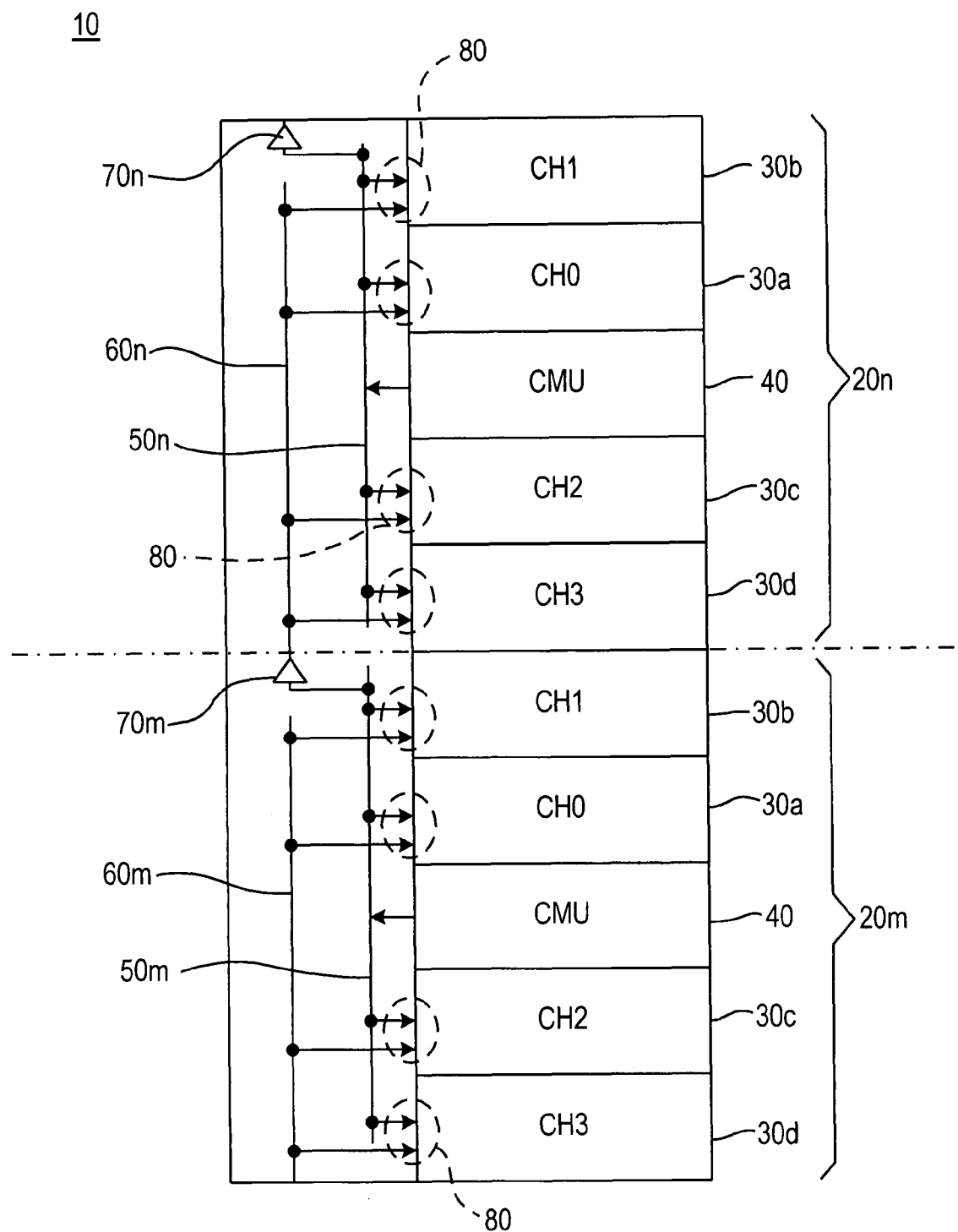
FIG. 1 is a simplified block diagram of a known architecture for producing, distributing, and using clock signals in transceiver circuitry on a PLD.

FIG. 1 shows a modular arrangement of circuitry on a PLD 10 that has heretofore proven successful in meeting a range of communication needs, including operation of up to eight channels in synchronism. In particular, FIG. 1 shows two "quads" 20m and 20n of transceiver circuitry. Each quad 20 includes four channels 30a-d of actual transceiver circuitry and one module 40 of clock multiplier (or management) unit ("CMU") circuitry. Each transceiver channel 30 can receive a serial data signal (e.g., a so-called high-speed serial data signal). Alternatively or in addition, each channel 30 can transmit a serial data signal (e.g., again a so-called high-speed serial data signal). Note that the CMU 40 in each quad 20 is preferably centrally located among the transceiver channels 30 of that quad.

Each CMU 40 can receive one or more reference clock signals and can produce one or more stabilized clock signals for use by transceiver channels of the device (PLD) as will be described in more detail below. For example, each CMU 40 may include one or more phase-locked loop circuits and frequency divider or multiplier circuits that can be used to stabilize and adjust the frequency of a reference clock signal for use by other components such as 30 on the device. For simplicity in the further discussion it will be assumed that each CMU 40 produces only one output clock signal. It will be understood that what is described below can be duplicated for any number of clock signals output by each CMU 40.

Clock distribution circuitry is provided for distributing the clock signal output by each CMU 40 to selected ones of transceiver channels 30. In particular, the clock signal output by each CMU 40 is applied to a clock distribution conductor 50 that extends to all of the channels 30 in the quad 20 that includes that CMU. Each conductor 50 does not, by itself, extend beyond the quad 20 from which it gets its clock signal. Adjacent an end of each conductor 50, that conductor is connected to the input terminal of a driver 70, which can apply the signal it thus receives to another clock distribution conductor 60 in the next quad 20. Thus, for example, driver 70m can be used to apply the signal on conductor 50m to conductor 60n. Each conductor 60 extends to all of the channels 30 in the quad 20 with which it is associated; but, again, each conductor 60 does not extend beyond the associated quad.

Each transceiver 30 in a quad 20 can get a clock signal it may need from either the conductor 50 or the conductor 60 associated with that quad. This clock signal selection may be made on the basis of programmable control and is indicated by the dotted shape 80 around the clock inputs to each channel 30. For example, the clock signal selected by a channel 30 may be used as the time base (clock) for a serial data signal being output (transmitted) from PLD 10 via that channel 30.

From the foregoing it will be seen that with the architecture shown in FIG. 1, the CMU 40 in a quad 20 can provide a clock signal for any one or more of the four transceiver channels 30 in that quad 20 and/or any one or more of the four transceiver channels 30 in one adjacent quad 20. For example, the CMU 40 in quad 20m can provide a clock signal for any one or more of the four channels 30 in quad 20m and/or any one or more of the four channels 30 in quad 20n. (In a configuration (use) of PLD 10 in which one or more channels 30 in quad 20n are using a clock signal from the CMU 40 in quad 20m, quad 20m may be referred to as the master quad and quad 20n may be referred to as the slave quad.) Although the FIG. 1 architecture can thus supply a common CMU clock signal to as many as eight channels 30 (e.g., for synchronizing the output signals of those as many as eight channels), this architecture does not readily lend itself to synchronizing more than eight channels 30.

The FIG. 1 architecture is similar to what is shown in commonly assigned Tran et al. U.S. Pat. No. 7,656,187.

Briefly recapitulating the above discussion of FIG. 1, each quad 20 has two clock trees 50 (for by-four (or ×4) bonding) and 60 (for by-eight (or ×8) bonding). Buffering 70 is strategically located on the master-slave boundary so that the ×4 clock tree 50 of a master quad 20 drives the ×8 tree 60 of a slave quad 20. As a result, two quads 20 are bonded together. Multiplexing 80 within each channel 30 can select from either clock tree 50 or 60. In this way, either configuration (×4 or ×8) can be chosen on a per channel basis. Two issues may present themselves as a result of this architecture. One of these possible issues is inability to bond more than eight channels 30. Another possible issue is inherent clock tree misbalance where channels 30 are not equally distributed away from master quad CMU 40 when that CMU is used to clock channels in both the associated master quad 20 and the adjacent slave quad 20. This second issue can limit maximum possible performance of a bonded configuration, as well as minimum achievable channel-to-channel skew.

Figure 2:
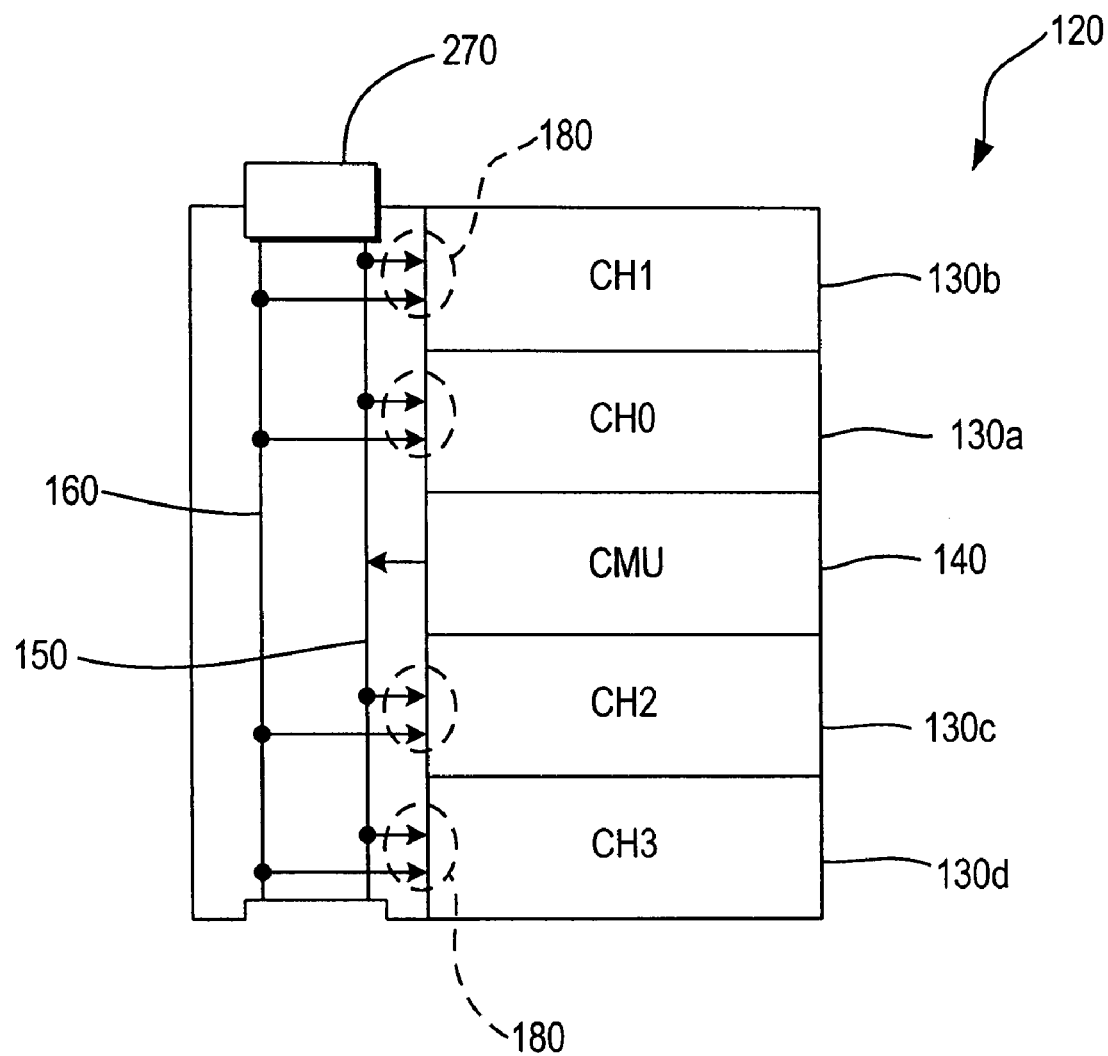
FIG. 2 is a simplified block diagram of an illustrative embodiment of representative circuitry in accordance with this invention.

An alternative quad-based architecture in accordance with the present invention is shown in FIG. 2. FIG. 2 shows one representative quad 120 by itself; subsequent FIGS. show multiple such quads together. In FIG. 2 and subsequent FIGS., reference numbers for elements that are similar to FIG. 1 elements are increased by 100 from the reference numbers of the corresponding FIG. 1 elements. Elements that are new in FIG. 2 and subsequent FIGS. have reference numbers in the 200 series.

In the FIG. 2 circuitry, two clock trees are still present as follows: clock tree 150 is the intra-quad tree, while tree 160 is the global clock tree. In addition, high-speed clock multiplexer circuitry 270 is introduced. This multiplexer circuitry 270 is placed on the boundary between two quads 120, and it has four ports, two coming from each quad. These four ports are as follows: (1) from the bottom quad: (a) intra-quad clock 150 (IQC), and (b) global clock tree 160 (GLT); and from the top quad: (a) intra-quad clock 150 (IQC), and (b) global clock tree 160 (GLT). As a result, the following two types of connection are possible between two adjacent quads: (1) IQC to GLT, and (2) GLT to GLT. Within each quad, connections from IQC to GLT are not provided. Also, IQC to IQC connections between adjacent quads are not provided.

Figure 3:
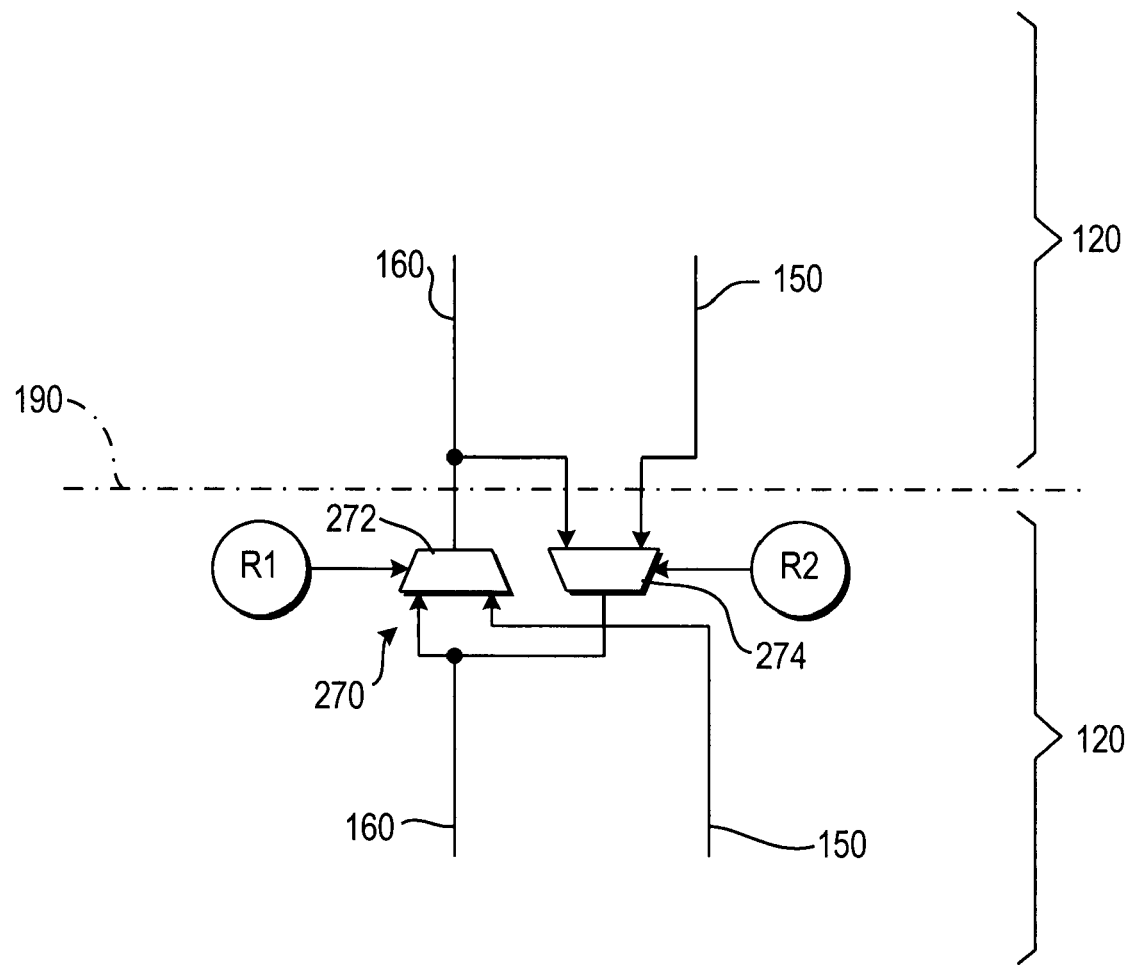
FIG. 3 is a more detailed diagram of an illustrative embodiment of a portion of the FIG. 2 circuitry in accordance with the invention.

FIG. 3 shows an illustrative embodiment of representative multiplexer circuitry 270 in more detail. As FIG. 3 shows, circuitry 270 includes multiplexer 272 and multiplexer 274. Multiplexer ("mux") 272 has two selectable inputs: conductors 150 and 160 from the quad 120 below inter-quad boundary 190. Mux 272 can be controlled by its selection control input signal (e.g., from PLD configuration RAM cell R1) to select either one of its two primary or selectable input signals as its output signal, which output signal is applied to the global clock tree conductor 160 of the quad 120 above inter-quad boundary 190. In this way, either the signal on the intra-quad conductor 150 or the signal on the global clock tree conductor 160 of the quad 120 below boundary 190 can be applied to the global clock tree conductor 160 of the quad 120 above boundary 190.

Alternatively to the immediately preceding, multiplexer 274 can be used to allow clock signals to cross boundary 190 in the other direction. In particular, mux 274 has two primary (selectable) inputs: intra-quad conductor 150 and global clock tree conductor 160 in the quad 120 above boundary 190. Mux 274 can be controlled by its selection control input signal (e.g., from PLD configuration RAM cell R2) to select either one of these primary inputs as its output signal, which is applied to the global clock tree conductor 160 of the quad 120 below boundary 190. In this way, either the signal on the intra-quad conductor 150 or the signal on the global clock tree conductor 160 of the quad above boundary 190 can be applied to the global clock tree conductor 160 of the quad 120 below boundary 190.

Figure 4:
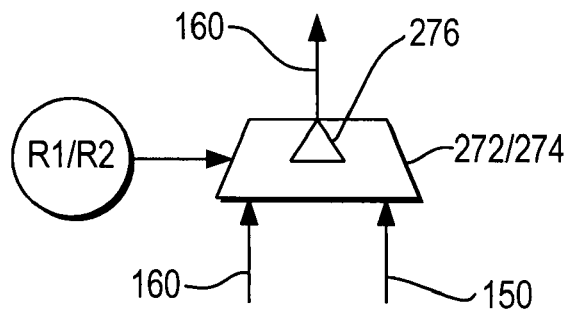
FIG. 4 is a still more detailed diagram of an illustrative embodiment of a portion of the FIG. 3 circuitry in accordance with the invention.

FIG. 4 shows that, if desired, in addition to its routing capability, each of muxes 272 and 274 may also include buffer circuitry 276 for rebuffering its output signal prior to applying that signal to the output global clock tree conductor 160.

Figure 5:
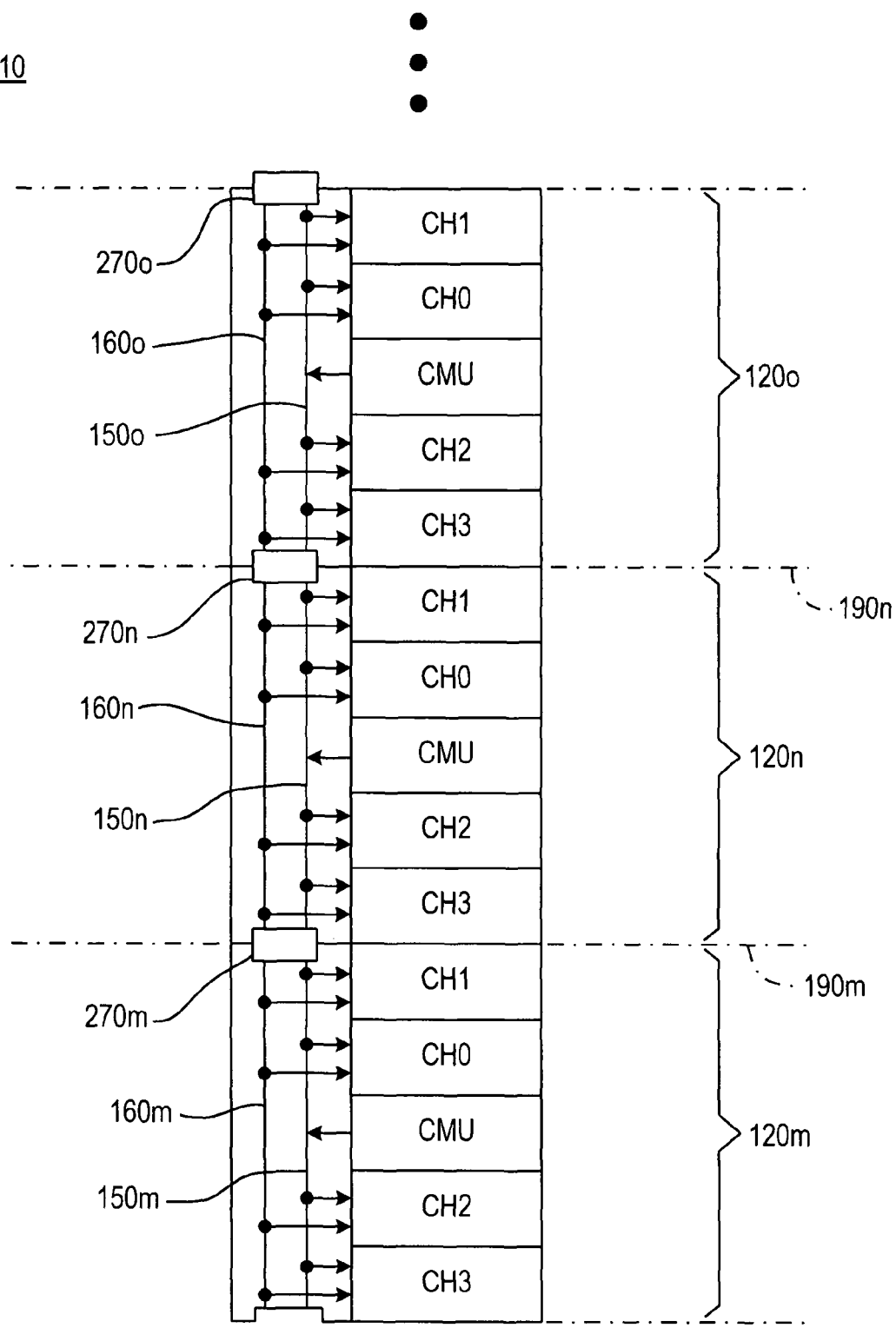
FIG. 5 shows use of several instances of circuitry of the type shown in FIG. 2 in accordance with the invention.

FIG. 5 shows how any number of modules like the one representative module (quad) 120 shown in FIG. 2 can be strung together on PLD 110. FIG. 5 shows a representative portion of a linear array of quads 120. In such an array, each quad 120 has another quad 120 adjacent each of its ends. For example, quad 120n has another quad 120m adjacent its lower end, and yet another quad 120o adjacent its upper end.

Observing what is shown in FIGS. 2-5, one will note that in this architecture any quad 120 can become a master quad. Moreover, any such master quad 120 can drive either up or down or in both directions (i.e., both up and down). In addition, quad bonding can extend beyond immediately adjacent quads because GLT-to-GLT provides global clock tree rebuffering. More than eight channels 130 can be synchronized by a clock signal from one CMU 140. The CMU that is used for synchronizing a large number of channels 130 can be located more centrally of those channels if desired. This can help to reduce maximum clock skew experienced by multiple channels 130 working together.

In summary, the present invention can provide a universal quad bonding architecture that allows unrestricted channel bonding in either direction, as well as providing strategic clock tree rebuffering points.

It will be understood that the foregoing is only illustrative of the principles of the invention, and that various modifications can be made by those skilled in the art without departing from the scope and spirit of the invention. For example, although the basic module (i.e., a quad) shown herein includes one CMU and four transceiver channels, it will be understood that such a basic module can instead have larger or smaller numbers of such components if desired.

The invention claimed is:

1. Transceiver circuitry on a programmable logic device integrated circuit comprising:
   a plurality of circuit modules, each of which includes:
   (1) a plurality of channels of transceiver circuitry;
   (2) a clock source circuit;
   (3) a first clock signal distribution circuit extending from the clock source circuit to all of the channels in the module;
   (4) a second clock signal distribution circuit extending to all of the channels in the module; and
   (5) selection circuitry associated with each of the channels for allowing that channel to select a clock signal from either the first or second clock signal distribution circuit;
   first routing circuitry for allowing either the first or second clock signal distribution circuit of each module to supply a signal to the second clock signal distribution circuit of a first adjacent one of the modules; and
   second routing circuitry for allowing either the first or second clock signal distribution circuit of each module to supply a signal to the second clock signal distribution circuit of a second adjacent one of the modules.

2. The circuitry defined in claim 1 wherein the modules are disposed on the programmable logic device in a linear array, and wherein for each module the first and second adjacent modules are at respective opposite ends of said each module.

3. The circuitry defined in claim 1 wherein each of the first and second routing circuitries comprises:
   buffering circuitry for buffering a signal passing through the routing circuitry.

4. The circuitry defined in claim 1 further comprising for each of the first and second routing circuitries:
   a control signal source for controlling which routing allowed by that routing circuitry is actually implemented.

5. The circuitry defined in claim 4 wherein the control signal source is a programmable component of the programmable logic device integrated circuit.

6. The circuitry defined in claim 1 wherein each module includes one instance of each of the first and second routing circuitries.

7. Transceiver circuitry on a programmable logic device integrated circuit comprising:
   a plurality of channels of transceiver circuitry that are grouped into several subpluralities of such channels;
   a clock source circuit associated with each of the subpluralities;
   first and second clock distribution circuitries associated with each of the subpluralities and each extending to all of the channels in the associated subplurality, the first clock distribution circuitry receiving a clock signal from the clock source circuit associated with that subplurality;
   selection circuitry associated with each of the channels for allowing that channel to select a clock signal from either of the first and second clock distribution circuitries associated with the subplurality that includes that channel; and
   routing circuitry associated with each of the subpluralities for allowing the second clock distribution circuitry associated with that subplurality to either receive a signal from either of the first and second clock distribution circuitries associated with either of two other subpluralities that are adjacent to that subplurality, or to supply a signal to the second clock distribution circuitry associated with either of those two other subpluralities.

8. The circuitry defined in claim 7 wherein the subpluralities are disposed on the programmable logic device in a linear array, and wherein for each subplurality the two other subpluralities are disposed at respective opposite ends of said each subplurality.

9. The circuitry defined in claim 7 wherein each of the routing circuitries includes:
   buffering circuitry for buffering a signal passing through that routing circuitry.

10. The circuitry defined in claim 7 further comprising for each of the routing circuitries:
    a control signal source for controlling which connection allowed by that routing circuitry is actually made.

11. The circuitry defined in claim 10 wherein the control signal source comprises programmable circuitry of the programmable logic device integrated circuit.

12. Transceiver circuitry on a programmable logic device comprising:
    a plurality of channels of transceiver circuitry;
    a plurality of clock source circuits distributed among the channels;
    a first clock distribution circuit associated with each of the clock source circuits for distributing a clock signal from that clock source circuit to a subplurality of the channels that are adjacent to that clock source circuit;
    a second clock distribution circuit associated with each of the first clock distribution circuits and coextensive therewith;
    selection circuitry associated with each of the channels for allowing that channel to get a clock signal from either the first clock distribution circuit that distributes a clock signal to that channel or from the second clock distribution circuit that is associated with that first clock distribution circuit; and
    routing circuitry for allowing each of the second clock distribution circuits to either supply a signal to either of two others of the second clock distribution circuits, or to receive a signal from either of those two others of the second clock distribution circuits or either of the first clock distribution circuits with which those two others of the second clock distribution circuits are associated.

13. The circuitry defined in claim 12 wherein the routing circuitry includes buffering circuitry for buffering a signal passing through the routing circuitry.

14. The circuitry defined in claim 12 wherein the routing circuitry is programmable with respect to the routing it performs.

15. The circuitry defined in claim 12 wherein each of the selection circuitries is programmable with respect to the selection that it makes.

16. The circuitry defined in claim 12 wherein each of the subpluralities includes four of the channels.

17. The circuitry defined in claim 16 wherein each of the subpluralities includes no more than four of the channels.

* * * * *